(12) United States Patent
Park et al.

(10) Patent No.: US 8,050,101 B2
(45) Date of Patent: Nov. 1, 2011

(54) NONVOLATILE MEMORY DEVICES HAVING ERASED-STATE VERIFY CAPABILITY AND METHODS OF OPERATING SAME

(75) Inventors: Kitae Park, Gyeonggi-do (KR); Chanik Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 253 days.

(21) Appl. No.: 12/543,993

(22) Filed: Aug. 19, 2009

(65) Prior Publication Data

US 2010/0074025 A1 Mar. 25, 2010

(30) Foreign Application Priority Data

Sep. 22, 2008 (KR) ........................ 10-2008-0092856

(51) Int. Cl.
*G11C 16/04* (2006.01)
(52) U.S. Cl. .............................. 365/185.22; 365/185.12

(58) Field of Classification Search ............. 365/185.22, 365/185.12, 185.17
See application file for complete search history.

(56) References Cited

U.S. PATENT DOCUMENTS

| | | | | |
|---|---|---|---|---|
| 5,768,188 A * | 6/1998 | Park et al. | ................. | 365/185.03 |
| 7,031,192 B1 * | 4/2006 | Park et al. | ................. | 365/185.22 |
| 2007/0242524 A1 | 10/2007 | Hemink | | |
| 2008/0013378 A1 | 1/2008 | Crippa et al. | | |
| 2008/0158997 A1 * | 7/2008 | Hemink et al. | ........... | 365/185.22 |

FOREIGN PATENT DOCUMENTS

| | | |
|---|---|---|
| JP | 2005-353242 | 12/2005 |
| KR | 1020050101159 A | 10/2005 |

\* cited by examiner

*Primary Examiner* — Vu Le
(74) *Attorney, Agent, or Firm* — Myers Bigel Sibley & Sajovec, P.A.

(57) ABSTRACT

A program method of a nonvolatile memory device includes applying a program voltage to program cells for changing data; verifying the program cells, based on the changed data; and verifying program inhibit cells for maintaining stored data even when the program voltage is applied to the program inhibit cells, based on the stored data.

10 Claims, 16 Drawing Sheets

NONVOLATILE MEMORY DEVICES HAVING ERASED-STATE VERIFY CAPABILITY AND METHODS OF OPERATING SAME

REFERENCE TO PRIORITY APPLICATION

This U.S. patent application claims priority under 35 U.S.C §119 to Korean Patent Application No. 10-2008-0092856, filed Sep. 22, 2008, the contents of which are hereby incorporated herein by reference.

FIELD OF THE INVENTION

The present invention relates to nonvolatile memory devices and methods of operation same.

BACKGROUND

Nonvolatile memory devices retain data written in their cells even when their power supplies are interrupted. The nonvolatile memory devices include flash memory devices. Since flash memory devices can perform electrically batch-erasing operation for data of their cells, they have been widely used in computers and memory cards.

Flash memory devices may be classified into NOR flash memory devices and NAND flash memory devices according to the connection states of cells and bitlines. NOR flash memory devices can easily cope with the speeding up of operations while being disadvantageous in high integration due to their high power consumption. On the other hand, NAND flash memory devices are advantageous in high integration due to their lower consumption of cell current than NOR flash memory devices.

SUMMARY

A nonvolatile memory device according to an embodiment of the invention includes a nonvolatile memory cell array having word lines and bit lines therein. A control circuit is also provided. This control circuit is electrically coupled to the word lines and bit lines of the memory cell array. According to some of these embodiments of the invention, the control circuit may include control logic, a row decoder and I/O buffer and column selection circuitry, for example. The control circuit may be configured to program a first plurality of nonvolatile memory cells in a first page of the nonvolatile memory cell array with first data using an incremental step pulse programming operation. This programming operation may include a first plurality of verification operations that confirm whether all of the first plurality of nonvolatile memory cells has been sufficiently programmed. The control circuit is further configured to follow the incremental step pulse programming operation with at least one operation to verify whether a second plurality of nonvolatile memory cells in the first page remain as program inhibited memory cells that have not been programmed. According to additional embodiments of the invention, the control circuit may also be configured to program a first plurality of nonvolatile memory cells in a second page of the nonvolatile memory cell array with the first data upon verification that at least one of the second plurality of nonvolatile memory cells in the first page has been erroneously programmed to have an excessively high threshold voltage.

According to still further embodiments of the invention, a nonvolatile memory device includes a nonvolatile memory cell array having word lines and bit lines therein. A control circuit is also provided, which is electrically coupled to the word lines and bit lines. The control circuit is configured to program a first plurality of nonvolatile memory cells in a first page of the nonvolatile memory cell array with first data using a programming operation. This programming operation includes at least a first verify operation to confirm that all of the first plurality of nonvolatile memory cells have been sufficiently programmed. The programming operation also includes at least a second verify operation to confirm that a second plurality of nonvolatile memory cells in the first page remain as erased memory cells. According to some of these embodiments of the invention, the at least a second verify operation follows a last of the at least a first verify operation in time during the programming operation.

DETAILED DESCRIPTION OF THE EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

A nonvolatile memory device according to the present invention is embodied to verify not only program target memory cells but also non-program target memory cells during a program operation. The memory cells to be programmed mean memory cells for leading to fluctuation of a threshold voltage to change data. Accordingly, a programming method according to the present invention may considerably reduce time overhead resulting from a reprogramming operation performed when program failure occurs.

Figure 1:
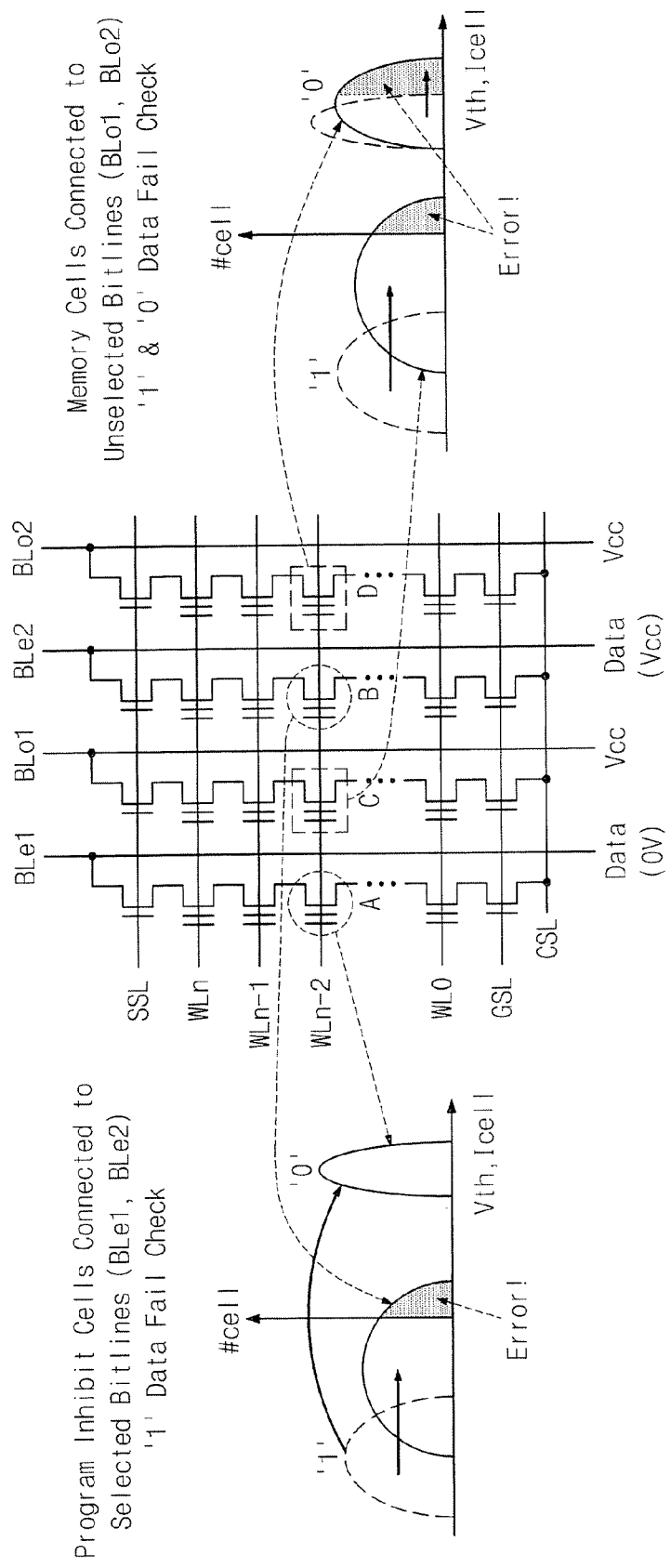
FIG. 1 is a concept diagram according to the present invention.

FIG. 1 illustrates an embodiment of the present invention. A nonvolatile memory device according to the present invention performs a '0' data verify operation for a program cell "A" connected to selected bitlines BLe1 and BLe2 and a '1' data verify operation for a program inhibit cell "B" connected to the selected bitlines BLe1 and BLe2. Also the nonvolatile memory device performs '1' and '0' data verify operations for memory cells "C" and "D" connected to unselected bitlines BLo1 and BLo2. The program cell "A" is a memory cell for leading to fluctuation of a threshold voltage to correspond to '0' data, and the program inhibit cell "B" is a memory cell for maintaining a threshold voltage corresponding to '1' data. It is assumed that the memory cells "C" and "D" connected to the selected bitlines BLo1 and BLo2 were previously programmed. Thus, during a program operation of the memory cells "A" and "B" connected to the selected bitlines BLe1 and BLe2, the memory cells "C" and "D" connected to the unselected bitlines BLo1 and BLo2 are inhibited from programming to maintain threshold voltages corresponding to their stored data, respectively.

As illustrated in FIG. 1, the nonvolatile memory device checks data change of the program inhibit cell "B" having '1' data or data change of the memory cells "C" and "D" connected to the unselected bitlines BLo1 and BLo2 during a program operation of the memory cells "A" and "B" connected to the selected bitlines BLe1 and BLe2. That is, the nonvolatile memory device checks '1' data failure of the program inhibit cell "B" connected to the selected bitlines BLe1 and BLe2 and '1' and '0' data failure of the memory cells "C" and "D" connected to the unselected bitlines BLo1 and BLo2.

As set forth above, the nonvolatile memory device itself may verify data stored in non-program target memory cells to check data error of a non-program target memory cell during a program operation.

Figure 2:
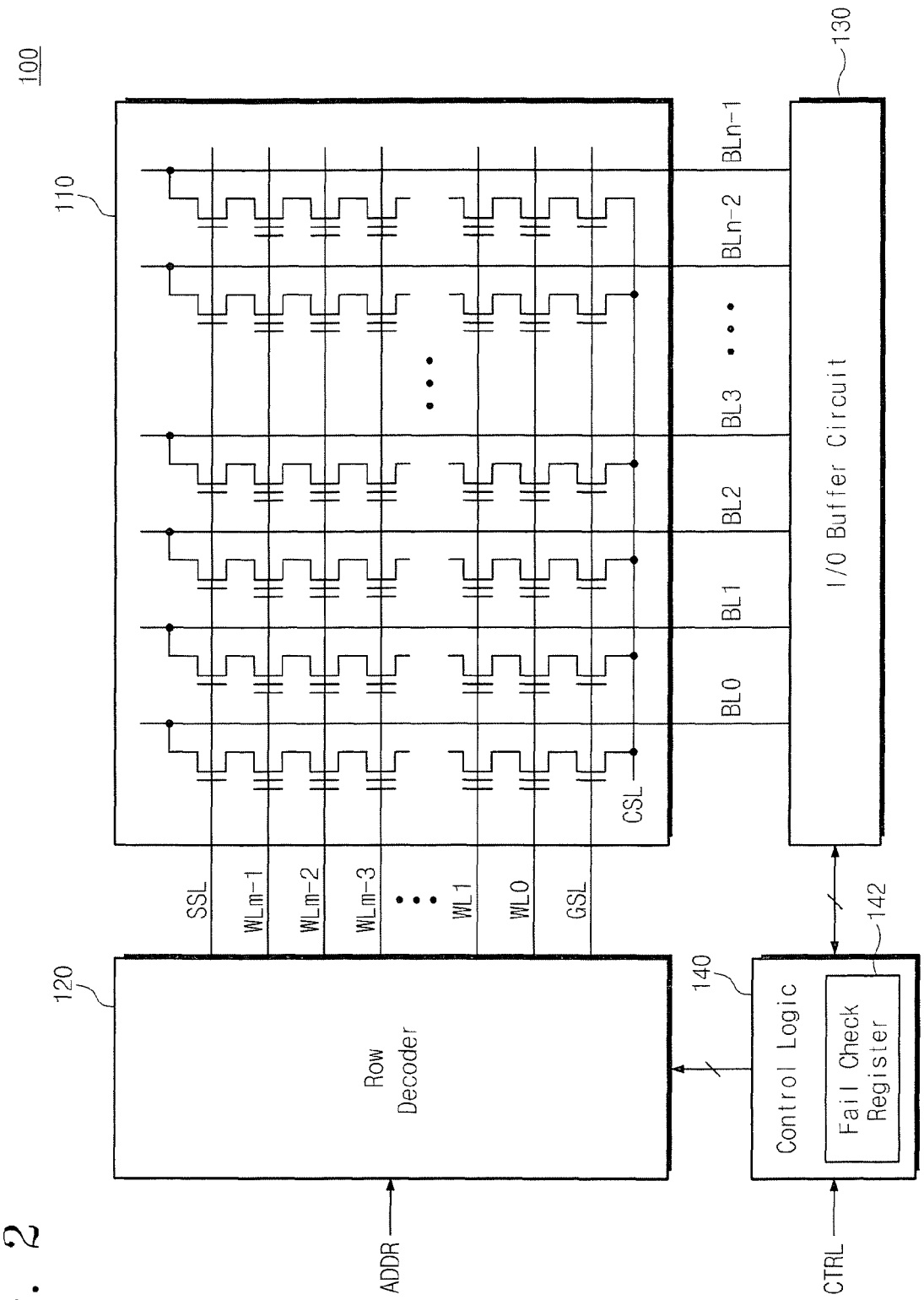
FIG. 2 illustrates a nonvolatile memory device according to a first embodiment of the present invention.

FIG. 2 illustrates a nonvolatile memory device 100 according to a first embodiment of the present invention. The nonvolatile memory device 100 includes a memory cell array 110, a row decoder 120, an input/output (I/O) buffer circuit 130, and a control logic 140. The control logic 140 enables the nonvolatile memory device 100 to verify all data stored in program inhibit cells and program cells connected to a selected wordline during a program operation. The program cells are memory cells where fluctuation of a threshold voltage is done to change their stored data, and the program inhibit cells are memory cells where a threshold voltage is maintained to prevent change of their stored data. Especially, the control logic 140 includes a failure check register 142 configured to store the verify result of all the data upon a program operation.

Although the nonvolatile memory device 100 is a NAND flash memory device, it is not limited thereto. A nonvolatile memory device according to the present invention may be applied to various kinds of nonvolatile memory devices such as MRAM, PRAM, and FRAM. Also the nonvolatile memory device according to the present invention may be embodied with a three-dimensional array structure.

The memory cell array 110 may include a plurality of bitlines BL0-BLn−1, a plurality of wordlines WL0-WLm−1, and a plurality of memory cells arranged at intersections of bitlines and wordlines. Multi-bit data may be stored in respective memory cells. The memory cell array 110 may comprise a plurality of memory blocks even though only one memory block is illustrated in FIG. 2. Each of the memory blocks includes a plurality of cell strings, each comprising a string selection transistor, a ground selection transistor, and memory cells serially coupled between the string selection transistor and the ground selection transistor.

In the respective strings, a drain of a string selection transistor is connected to a corresponding bitline and a source of a ground selection transistor is connected to a common source line CSL. A plurality of wordlines WL0-WLm−1 are arranged to cross a string. Wordlines WL0-WLm−1 are connected to corresponding memory cells of each of the strings, respectively. A selected wordline is supplied with program/read voltages, programming/reading data to/from selected memory cells. Bitlines BL0-BLn−1 are electrically connected to page buffers (not shown) of the I/O buffer circuit 130.

The row decoder 120 selects a memory block according to an input address ADDR and selects a wordline to be driven of the selected memory block. For example, the row decoder 120 decodes an input address ADDR to select a wordline to be driven in a selected memory block during a program operation. In this case, a program voltage from a high voltage generator (not shown) is applied to a selected wordline.

The I/O buffer circuit 130 includes a plurality of page buffers (not shown) configured to temporarily store data loaded into the memory cell array 110 during a program operation or temporarily store data read from the memory cell array 110 during a read operation. Each of the page buffers is connected to the memory cell array 110 through their corresponding bitlines BL0-BLn−1.

The page buffers apply a ground voltage (e.g., 0V) or a power supply voltage Vcc to a bitline according to data loaded during a program operation. For example, a ground voltage (0V) is applied to a bitline connected to a page buffer into which '0' data is loaded (i.e., a bitline connected to a program cell), and a power supply voltage Vcc is applied to a bitline connected to a page buffer into which '1' data is loaded (i.e., a bitline connected to a program inhibit cell).

The page buffers according to the present invention are configured to read and hold externally transferred data to be programmed during a program operation or data previously stored in memory cells to be programmed.

The control logic 140 generates high voltages needed for respective operations in response to input control signals CTRL (e.g., /CE, /RE, /WE, CLE, ALE, and /WP) and applies the high voltages to the row decoder 120. Also the control logic 140 controls general operations of internal blocks.

The control logic 140 is constructed to verify all data of program cells and program inhibit cells during a program operation. For example, the control logic 140 is configured to verify '0' data of selected cells after programming '0' data of program cells and verify '0' data of program inhibit cells. The verify result of all data is stored in the failure check register 142. The failure check register 142 stores information on whether the program cells are successfully programmed or whether data of the program inhibit cells is changed. When one of the program cells is not successfully programmed or data of one of the program inhibit cells is changed, the failure check register 142 stores bits corresponding to program fail.

The failure check register 142 is configured to store information on whether '0' data is successfully programmed into the program cells or whether '1' data of the program inhibit cells is successfully verified.

When program failure occurs, the program operation is performed to another wordline, which will be called a "reprogram operation" hereinafter. In the present invention, a reprogram operation may be performed to be controlled by an external memory controller (not shown) or to be controlled itself in the control logic 140 of the nonvolatile memory device.

First, in the case that a reprogram operation is controlled by a memory controller, the memory controller reads program fail bits stored in the failure check register 142 and transfers a reprogram command and a new address to the nonvolatile memory device 100 depending on the reading result. Thus, the nonvolatile memory device 100 performs a preprogram operation to a wordline corresponding to the new address. In this case, it is not necessary to externally receive data to be reprogrammed because the data was previously held to the respective page buffers.

Second, in the case that a reprogram operation is controlled itself in the nonvolatile memory device 100, the control logic 140 reads program fail bits stored in the failure check register 142 and performs a reprogram operation to a wordline corresponding to a new address depending on the reading result. In this case, it is not necessary to externally receive data to be reprogrammed because the data was previously held to the respective page buffers.

As described above, it is not necessary for the nonvolatile memory device 100 according to the present invention to load separate data to be programmed from the outside when reprogramming occurs.

In a typical nonvolatile memory device, program inhibit cells do not perform a failure check operation of '1' data. For this reason, there is no chip-level solution or system-level solution when program failure arises from failure of '1' data or fail bit arises from degradation of a pass voltage window.

Meanwhile, the nonvolatile memory device 100 executes a self-diagnosis program to verify all data of program cells and program inhibit cells. When the self-diagnosis program is executed, it is not necessary to externally reload data even though a reprogram operation is performed due to program fail. This is because data corresponding to selected cells and unselected cells were previously loaded into a page buffer.

As a result, in view of a reprogram operation performed due to program fail, programming time in a program method according to the present invention may be much more reduced than that in a conventional program method.

Figure 3:
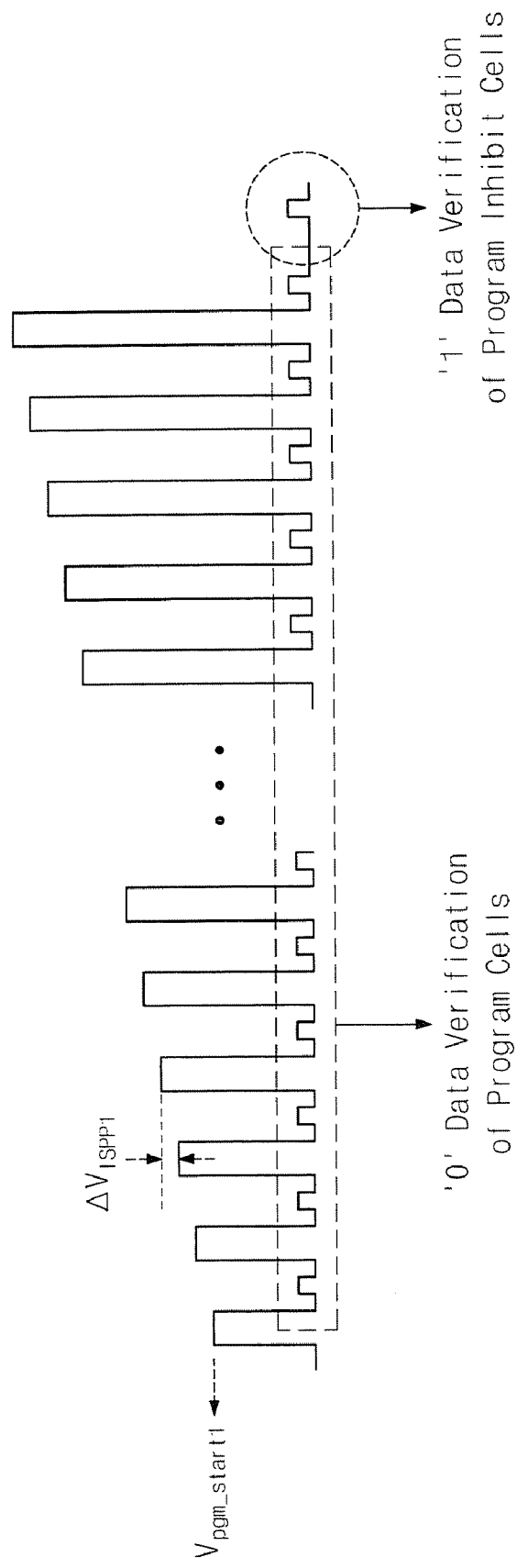
FIG. 3 illustrates an ISPP programming method of the nonvolatile memory device illustrated in FIG. 2.

FIG. 3 illustrates a program method of a nonvolatile memory device 100 according to the present invention. Referring to FIGS. 2 and 3, a program voltage is applied to a selected wordline while increasing by a first predetermined level $\Delta V_{ISPP1}$ from a first program start voltage Vpgm_start1. That is, the nonvolatile memory device 100 performs a program operation using an incremental step pulse programming (ISPP) scheme.

In each program loop, a '0' data verify operation is performed for program cells after applying a program voltage. If the '0' data verify operation is successfully performed for all the program cells, a '1' data program operation is performed for program inhibit cells. If a program operation is finally successfully performed, the program cells have a threshold voltage corresponding to the '0' data and the program inhibit cells are maintained at a threshold voltage corresponding to the '1' data.

In FIG. 3, a '1' data verify operation for the program inhibit cells is performed following completion of the '1' data program operation for the program cells. However, the '1' data verification of the nonvolatile memory device 100 according to the present invention does not necessarily include performing a '0' data program operation for the program cells. The '1' data verify operation for the program inhibit cells may be performed to each program loop or only a predetermined program loop circuit.

Figure 4:
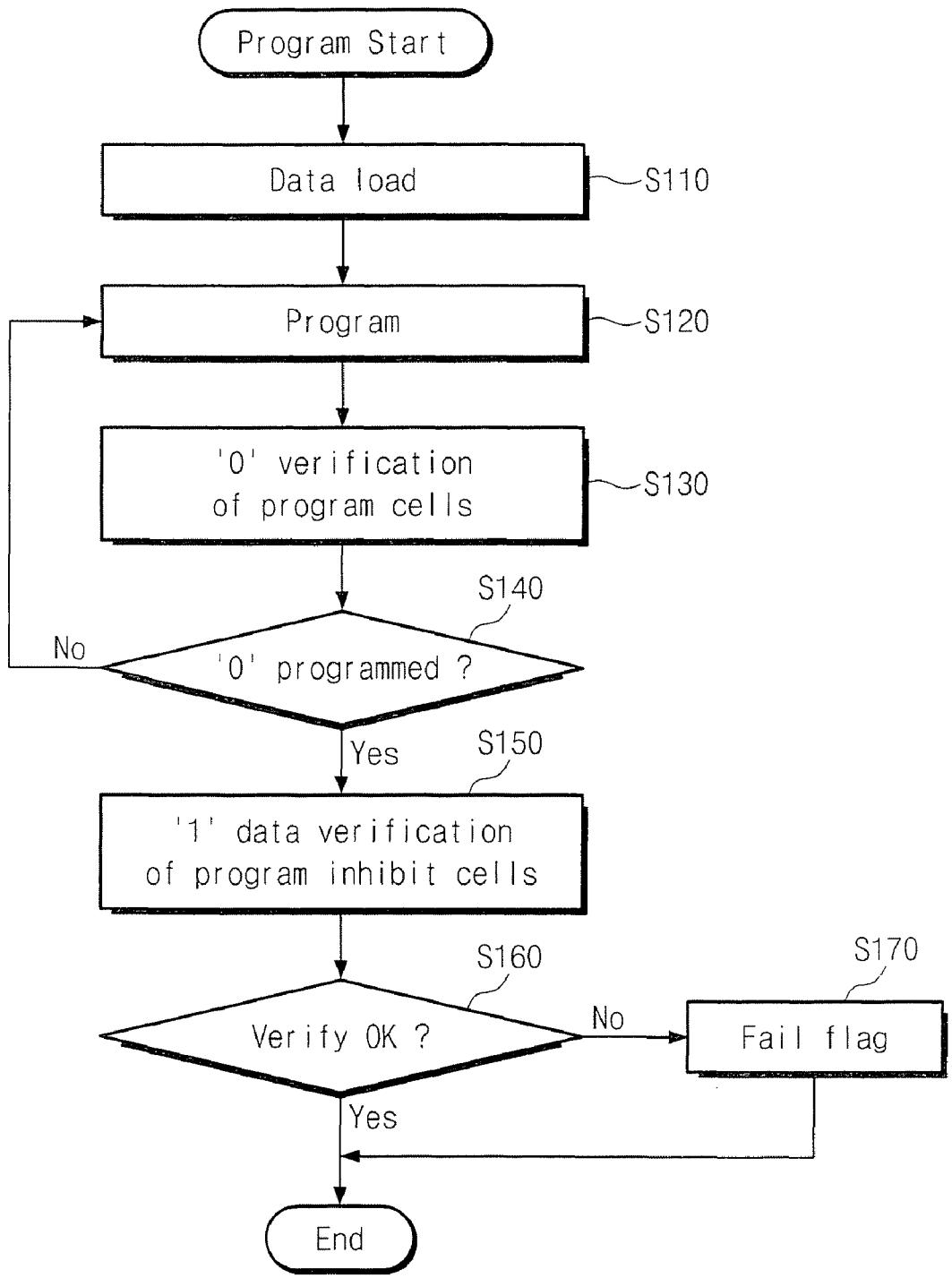
FIG. 4 is a first flowchart illustrating a programming method of the nonvolatile memory device illustrated in FIG. 2.

FIG. 4 is a first flowchart illustrating a programming method of the nonvolatile memory device 100 illustrated in FIG. 2. The programming method will now be described below in detail with reference to FIGS. 2 to 4.

During a program operation, a wordline corresponding to an input address ADDR is selected and data to be programmed is loaded into respective page buffers (S110). Respective bitlines BL0-BLn−1 are subjected to a bitline setup operation. For example, a program voltage (0V) is applied to bitlines corresponding to a page buffer into which program data '0' is loaded, and a program inhibit voltage Vcc is applied to bitlines corresponding to a page buffer into which program inhibit data '1' is loaded.

A '0' data program operation is performed for program cells among memory cells connected to a selected wordline (S120). As shown in FIG. 3, a program start voltage Vpgm_start1 is applied to a selected wordline to which the program cells are connected. After lapse of predetermined time, a '0' data verify operation is performed for the program cells (S130). The result of the '0' data verify operation is stored in a failure check register 142. Among the program cells, memory cells programmed by the '0' data program operation are inhibited from programming according to the verify result of the '0' data verify operation. For example, a power supply voltage Vcc may be applied from the memory cells programmed by the '0' data program operation. Among the program cells, in case of memory cells unprogrammed by the '0' data program operation, a program voltage increasing by a predetermined level $\Delta V_{ISSP1}$ is applied to a selected wordline to continuously perform a program operation according to the result of the '0' data verify operation (S140).

When all the program cells are programmed with '0' data a '1' data verify operation is performed for the program inhibit cells (S150). According to the result of the '0' data verification, it is determined whether the verify operation is successfully performed (S160).

If the '1' data verify operation is not successfully performed, a flag bit corresponding to program failure is stored in the failure check register 142 (S170) and the program operation is completed. When program failure occurs at a selected wordline, a reprogram operation will be performed later. Following completion of the program operation, a memory controller (not shown) transmits a read command for reading the flag bit stored in the failure check register 142 to the nonvolatile memory device 100. At this point, the nonvolatile memory device 100 transfers failed data stored in the failure check register 142 to the memory controller. Thus, the memory controller may confirm the program failure through the transmitted flag bit of the failure check register 142. When the transmitted flag bit corresponds to the program fail, the memory controller determines whether error can be corrected. If the error cannot be corrected, the memory controller transmits a preprogram command and a new address to the nonvolatile memory device 100 to perform a reprogram operation. The nonvolatile memory device 100 performs a program operation, based on the transferred program operation and new address.

If the '1' data verify operation is successfully performed, the program operation for the selected wordline is completed.

The program operation of the nonvolatile memory device 100 according to the present invention includes performing a '0' data verify operation for program cells and a '1' data verify operation for program inhibit cells. That is, the program method includes performing a verify operation for all data of the memory cells.

Figure 5:
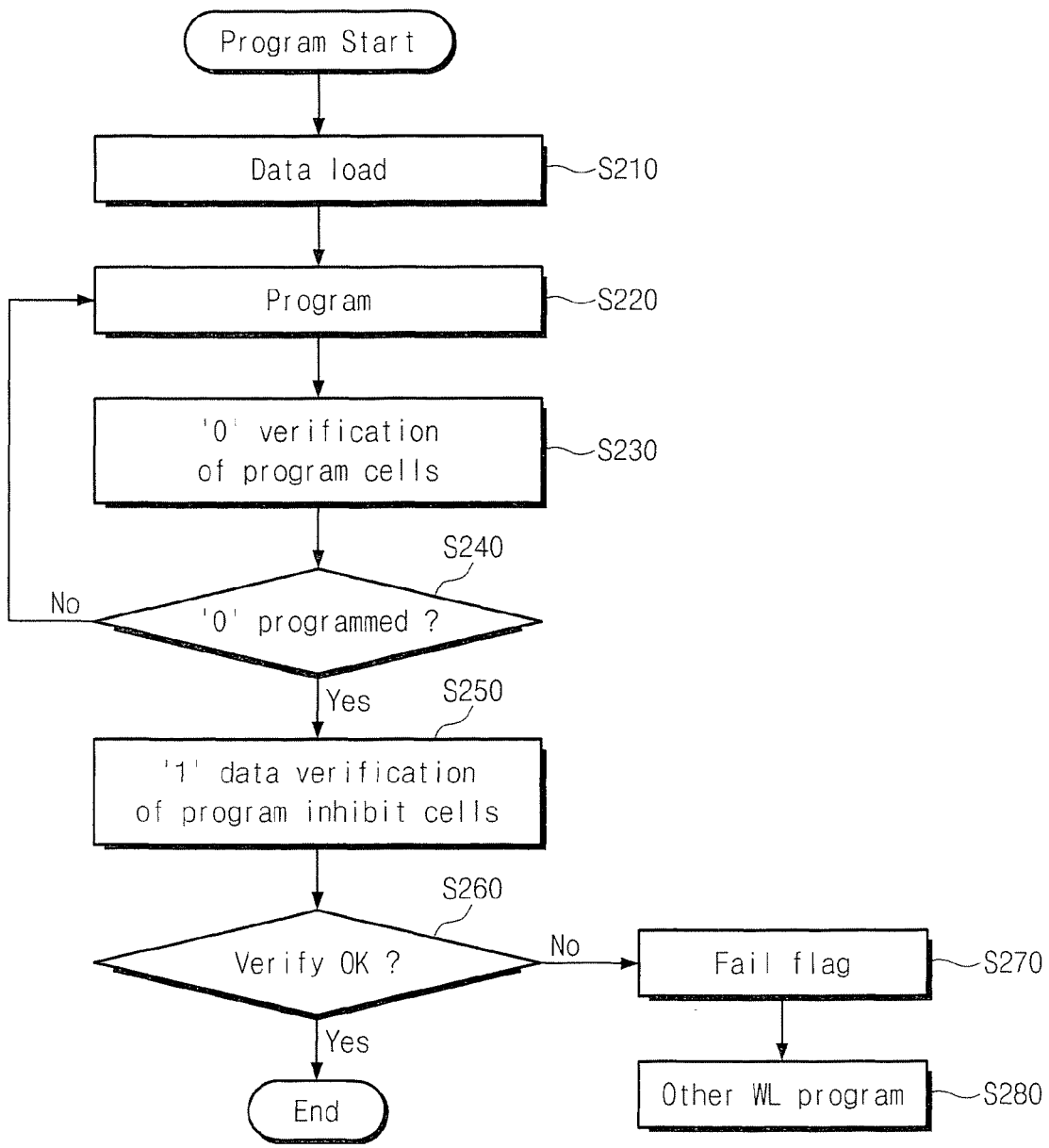
FIG. 5 is a second flowchart illustrating a programming method of the nonvolatile memory device illustrated in FIG. 2.

The nonvolatile memory device 100 itself may perform a reprogram operation without being controlled by the outside. FIG. 5 is a second flowchart illustrating a program method of the nonvolatile memory device 100 according to the present invention. Referring to FIG. 5, when program failure occurs, a program operation is not completed but performed to another wordline (S280), which is different from the program method illustrated in FIG. 4. The control logic 140 of the nonvolatile memory device 100 itself performs a reprogram operation, based on the flag bit stored in the failure check register 142. The reprogram operation is performed to a new wordline the same as the method illustrated in FIG. 5.

Figure 6:
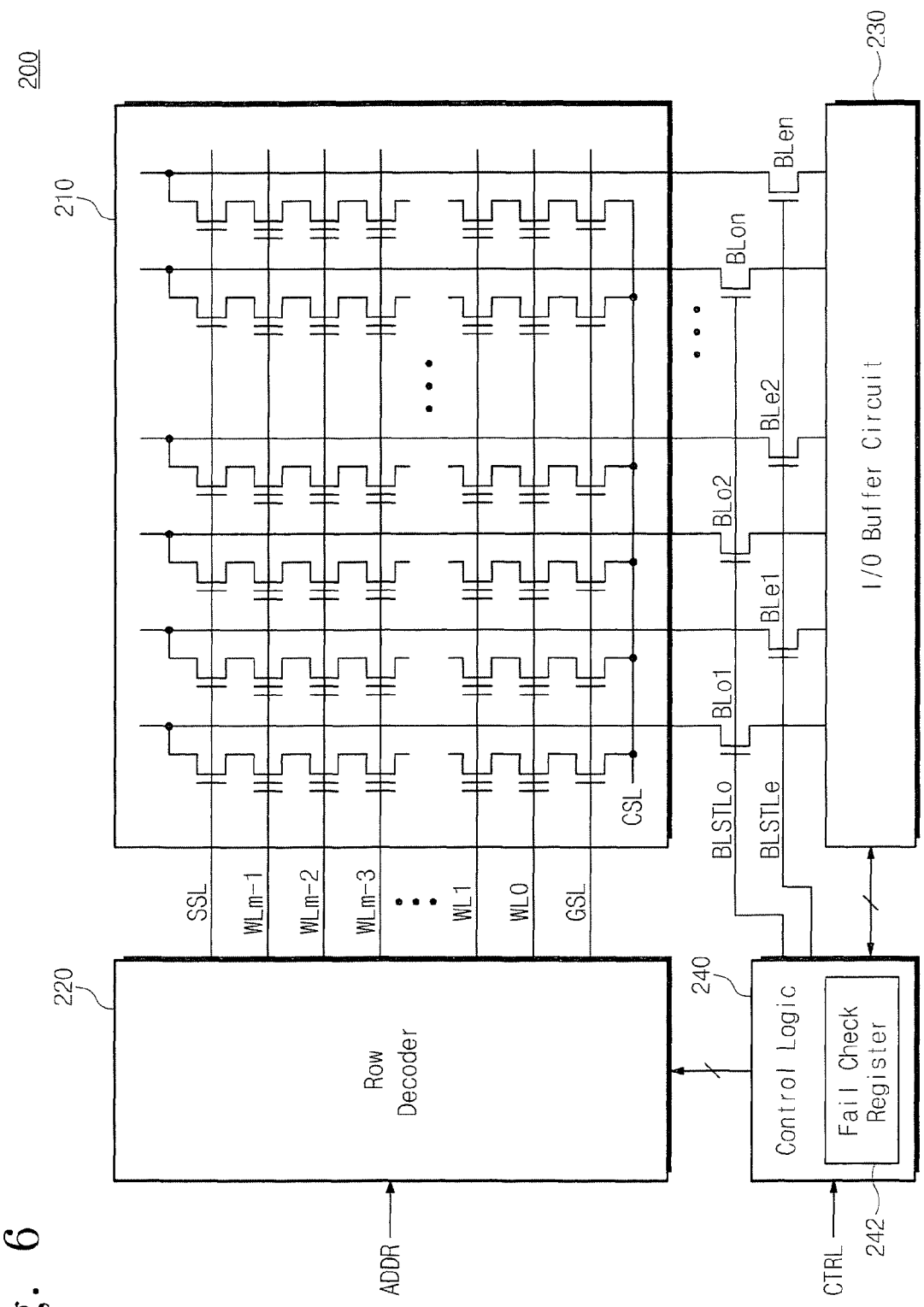
FIG. 6 illustrates a nonvolatile memory device according to a second embodiment of the present invention.

FIG. 6 illustrates a nonvolatile memory device 200 according to a second embodiment of the present invention. The nonvolatile memory device 200 programs memory cells connected to odd bitlines BLo1-Blon and programs memory cells connected to even bitlines BLe1-BLen. Particularly, the nonvolatile memory device 200 performs a '1' data verify operation for program inhibit cells connected to selected bitlines and '1' and '0' data verify operations for memory cells connected to unselected bitlines. The verification results are stored in a failure check register 242.

Figure 7:
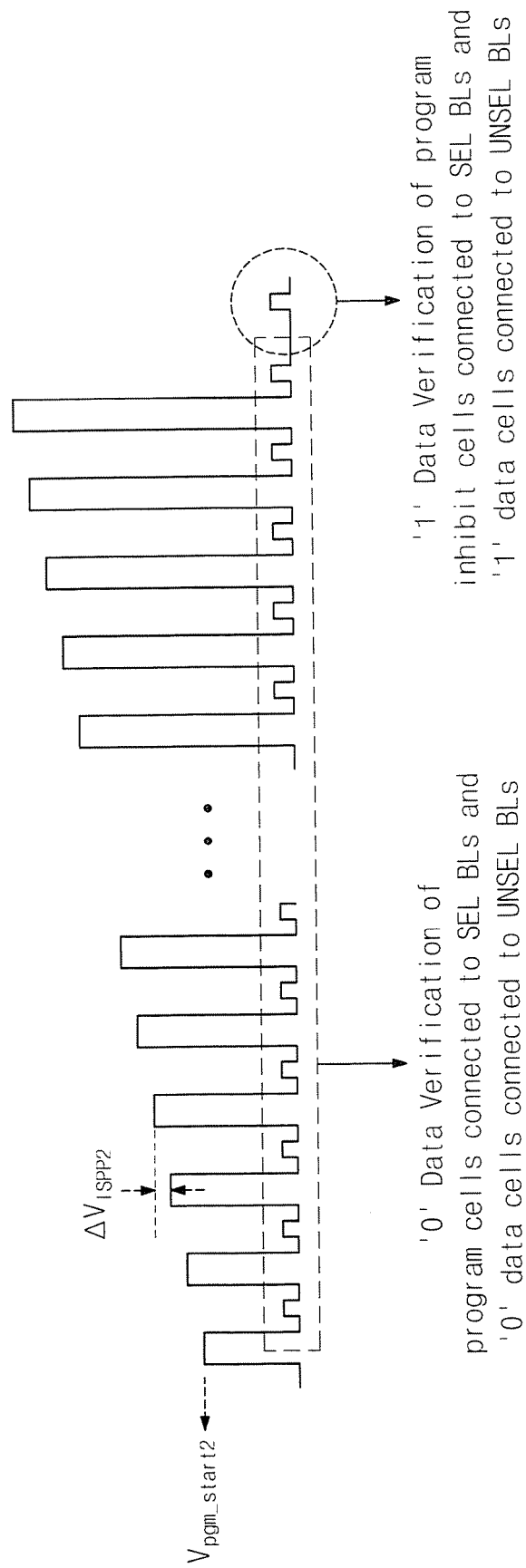
FIG. 7 illustrates a programming method of the nonvolatile memory device illustrated in FIG. 6.

FIG. 7 illustrates a program method of the nonvolatile memory device illustrated in FIG. 6. Referring to FIG. 7, a program voltage is applied to a selected wordline while increasing by a second predetermined level $\Delta V_{ISPP2}$ from a second program start voltage Vpgm_start2. In each program loop, a '0' data verify operation is performed for program cells connected to selected bitlines and '0' data cells connected to unselected bitlines. If a '0' data program operation for all program cells connected to the selected bitlines is completed, a '1' data verify operation is performed for program inhibit cells connected to the selected bitlines and '1' data cells connected to the unselected bitlines. Finally, '0' data is programmed into the program cells connected to the selected bitlines, '1' data is maintained at the program inhibit cells connected to the selected bitlines, and stored data are maintained at the memory cells connected to the unselected bitlines, respectively.

The program method according to the present invention includes performing a verify operation corresponding data stored in respective program inhibit cells connected to selected bitlines and respective memory cells connected to unselected bitlines. Thus, program failure diagnosis may be promoted.

Figure 8:
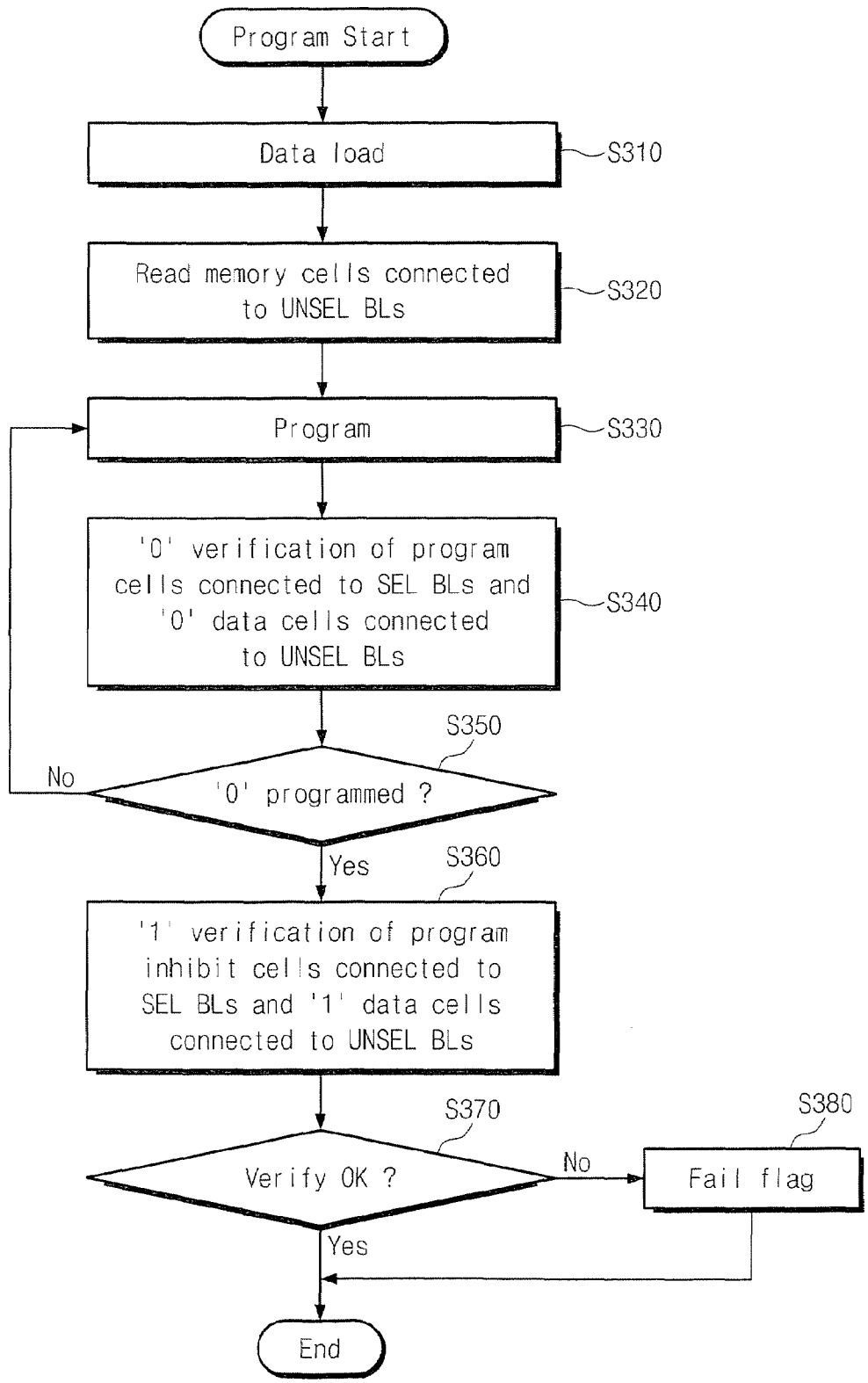
FIG. 8 is a first flowchart illustrating a programming method of the nonvolatile memory device illustrated in FIG. 6.

FIG. 8 is a first flowchart illustrating a program method of the nonvolatile memory device 200 illustrated in FIG. 6. The program method will now be described with reference to FIGS. 6 to 8. For the convenience of explanation, it is assumed that memory cells connected to odd bitlines BLo1-BL0n were previously programmed while memory cells connected to even bitlines BLe1-BLen are to be programmed. That is, it is assumed that the even bitlines BLe1-BLen are selected bitlines and the odd bitlines BLo1-Blon are unselected bitlines.

Data to be programmed is externally loaded to be stored in respective even page buffers (S310). The even page buffers correspond to the even bitlines BLe1-BLen, respectively. Since the program operation targets the memory cells connected to the even bitlines BLe1-BLen, the selected bitlines are the even bitlines BLe1-BLen and the unselected bitlines are odd bitlines BLo1-Blon.

After loading the data, the stored data are read from memory cells connected to the unselected odd bitlines BLo1-Blon (S320). The read-out data are held to odd page buffers, respectively. The unselected odd bitlines BLo1-BLon are controlled to be activated during a read operation.

Afterwards, the even bitlines BLe1-BLen corresponding to the even page buffers are activated to perform a program operation (S330). After the program operation is performed during predetermined time, a '0' data verify operation is performed for the program cells connected to the selected even bitlines BLe1-BLen and '0' data cells connected to the unselected odd bitlines BLo1-BLon (S340). According to the result of the '0' data verify operation, it is determined whether the '0' data program operation is completed (S350). If the '0' data program operation is not completed, a program voltage increases by a predetermined level and the foregoing steps are repeated.

If the '0' data program operation is completed, a '1' data verify operation is performed for program inhibit cells of the selected even bitlines BLe1-BLen and the unselected odd bitlines BLo1-BLon (S360).

According to the result of the '1' data verify operation, the verify operation is determined (S370). If the '1' data verify operation is "fail", the program operation is "fail". Thus, a flag bit corresponding to the verify operation failure is stored in a failure check register 242 and the program operation is completed.

If the '1' data verify operation is successfully performed, a program operation for the memory cells connected to the even bitlines BLe1-BLen is completed.

Figure 9:
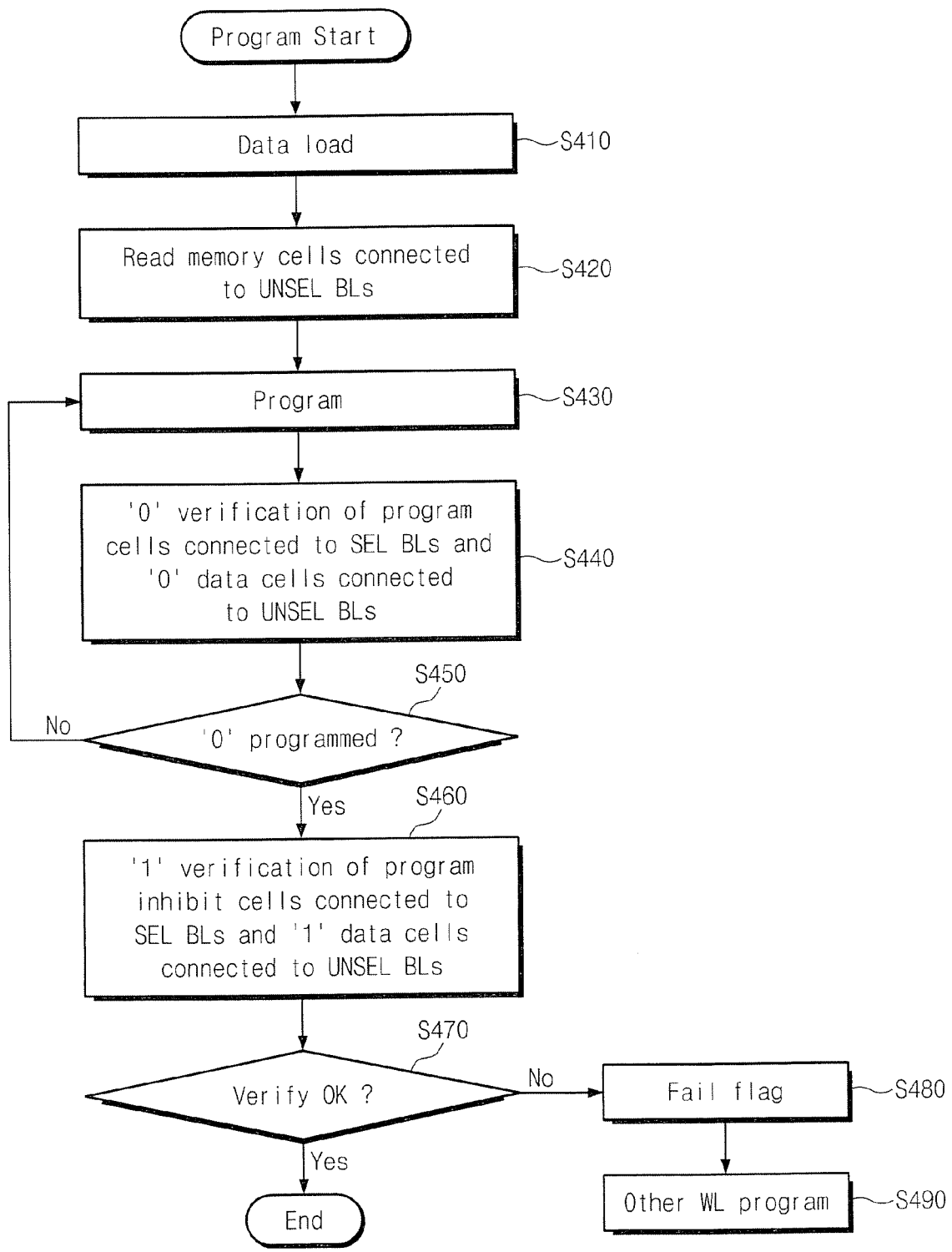
FIG. 9 is a second flowchart illustrating a programming method of the nonvolatile memory device illustrated in FIG. 6.

FIG. 9 is a second flowchart illustrating a program method of the nonvolatile memory device 200 illustrated in FIG. 6. Referring to a step S490 in FIG. 9, as compared to FIG. 9, the nonvolatile memory device 200 itself performs a reprogram operation when program failure occurs. A control logic 240 determines whether the reprogram operation is performed according to a flag bit stored in a failure check register 242.

In FIGS. 8 and 9, in each program loop, a '0' data verify operation is performed for '0' data cells connected to unselected bitlines. However, the programming method according to the present invention is not necessarily limited thereto. In the programming method, a '0' data verify operation may be performed for only program cells connected to selected bitlines in each loop.

Figure 10:
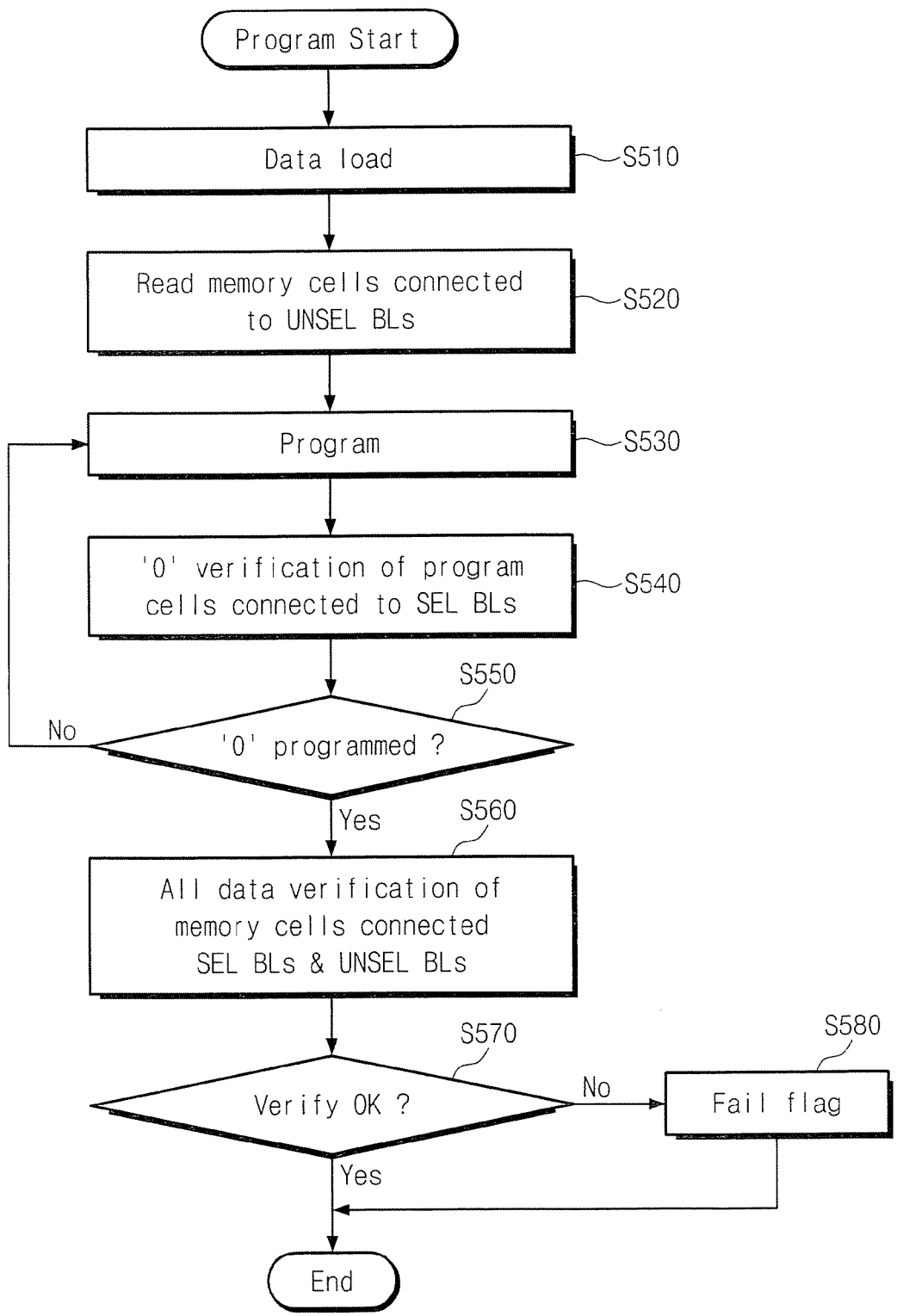
FIG. 10 is a third flowchart illustrating a programming method of the nonvolatile memory device illustrated in FIG. 6.

FIG. 10 is a third flowchart illustrating a program method of the nonvolatile memory device illustrated in FIG. 6. Referring to FIG. 10, in each loop, a '0' data verify operation is performed for only program cells connected to selected bitlines (S540). When the '0' data program operation for the selected bitlines is completed, a verify operation of all data is performed for memory cells connected to the selected bitlines and unselected bitlines (S560).

Figure 11:
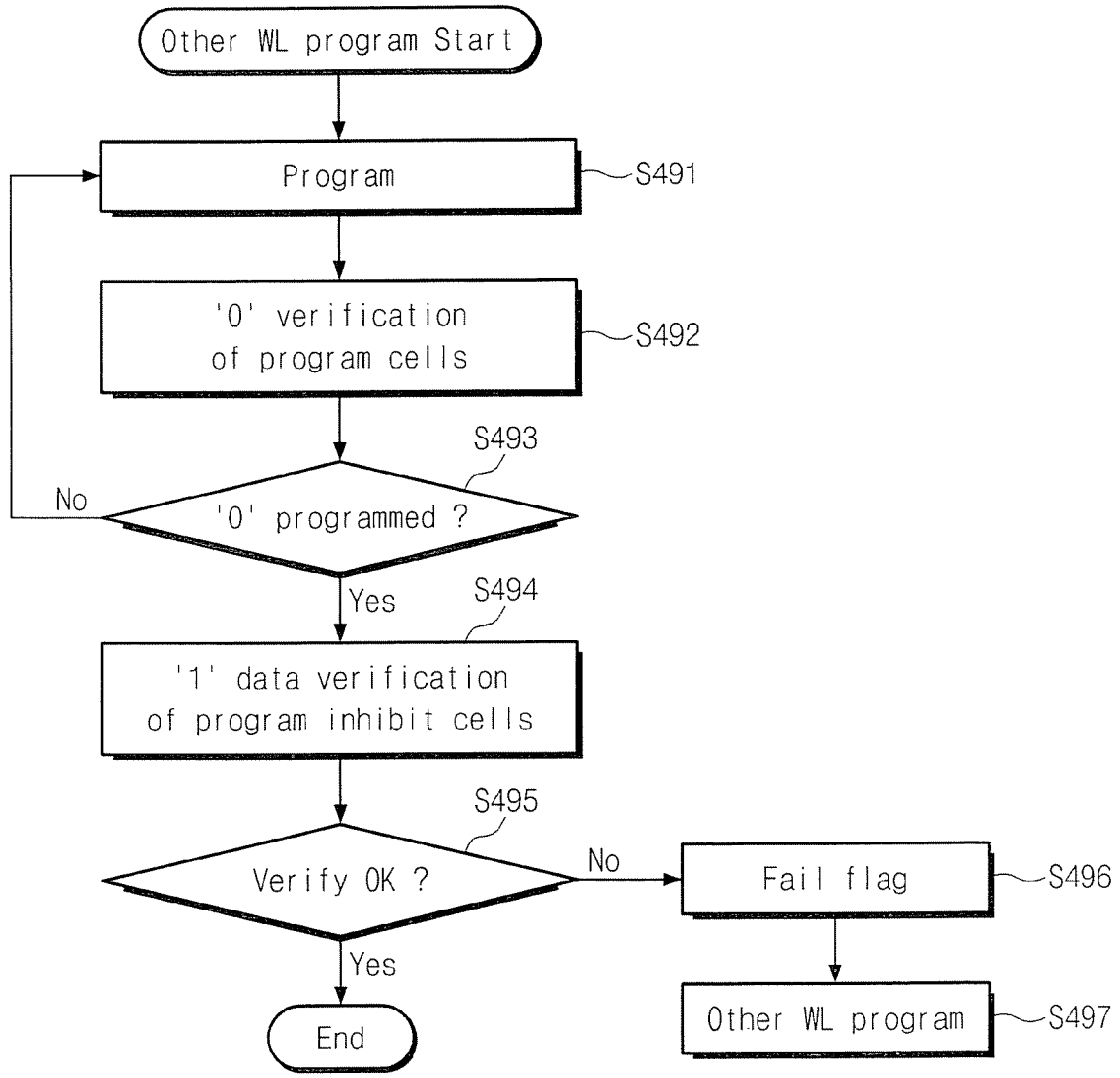
FIG. 11 is a flowchart illustrating a programming method to another wordline shown in FIG. 9.

FIG. 11 is a flowchart illustrating a programming method for another wordline when program failure occurs in the programming method illustrated in FIG. 10. The programming method for another wordline according to the present invention will now be described below with reference to FIGS. 6 and 11.

When programming for a selected wordline is "fail", a control logic 240 starts a reprogram operation for a new wordline. The control logic 240 generates a new address and transfers the new address to a row decoder 220. At this point, data corresponding to memory cells connected to selected bitlines and data corresponding to memory cells connected to unselected bitlines are held to respective pate buffers. Thus, bitlines corresponding to the respective page buffers are precharged to a program voltage (0V) or a program inhibit voltage Vcc. As illustrated in FIG. 7, a second program start voltage Vpgm_start2 is applied to a new wordline selected by a new address to perform a '0' data program operation (S491). A '0' data verify operation is performed for the program cells connected to the selected bitlines and the unselected bitlines (S492).

The '0' data verify operation is performed to determine whether the '0' data program operation is completed (S493). If the '0' data verify operation is "fail", a new wordline is supplied with a program voltage increasing by a second predetermined level $\Delta V_{ISPP2}$ from a second program start voltage to continue the program operation.

When all the program cells connected to the selected bitlines and the unselected bitlines are programmed using '0' data, a '0' data verify operation is performed for all program inhibit cells connected to the selected bitlines and the unselected bitlines (S494).

The control logic 240 determines whether the '1' data verify operation is successfully performed (S495). If the '1' data verify operation is successfully performed, the program operation for another wordline is completed. If the '1' data verify operation is "fail", the program operation for another wordline is "fail". Thus, a flag bit corresponding to the program failure is stored in a failure check register 242 (S496). Thereafter, the control logic 240 generates yet another address and performs a program operation for a wordline corresponding to the address.

Figure 12:
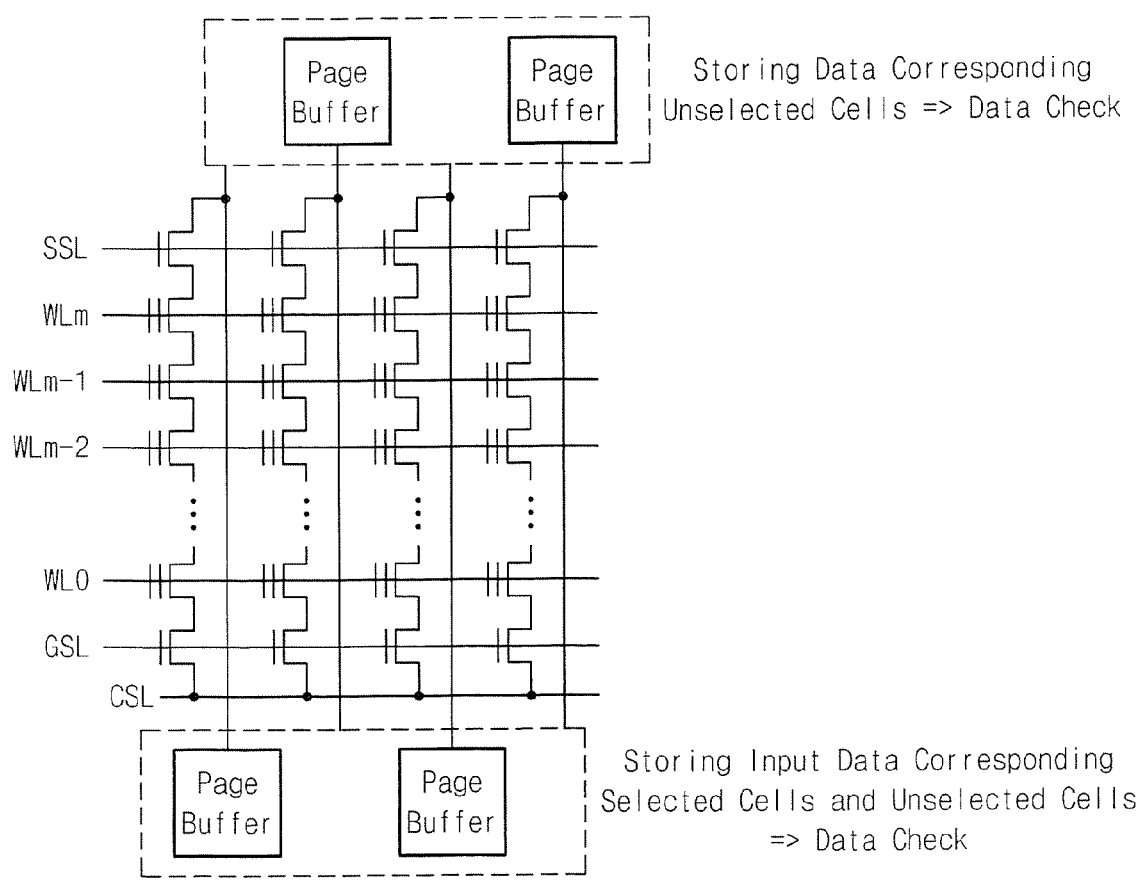
FIG. 12 illustrates operations of a page buffer according to the present invention.

FIG. 12 is illustrates functions of a page buffer according to the present invention. Referring to FIG. 12, page buffers according to the present invention read and store data of memory cells connected to unselected bitlines during a program operation and store externally loaded data. The data stored in the page buffer is used to check data during a verify operation.

According to the present invention, it is not necessary to input/output data to/from an external controller when a reprogram operation is performed for another wordline due to program fail. This is because each page buffer is storing data of selected cells and unselected cells.

Figure 13:
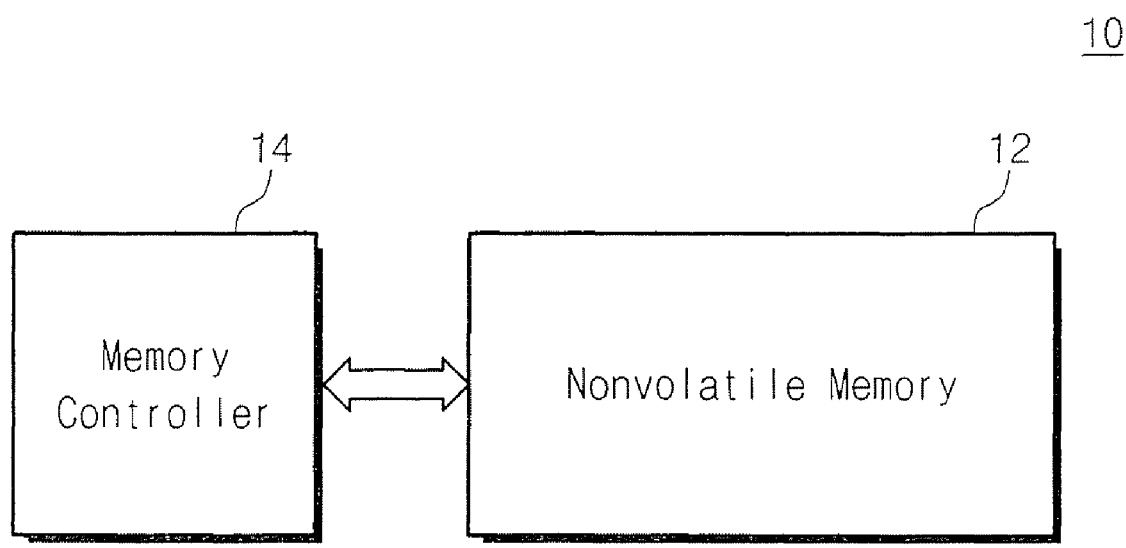
FIG. 13 illustrates a memory system according to the present invention.

FIG. 13 illustrates a memory system 10 according to the present invention. The memory system 10 includes a nonvolatile memory device 12 and a memory controller 14 configured to control the nonvolatile memory device 12. The nonvolatile memory device 12 has the same functions as illustrated in FIGS. 2 and 6.

In a typical memory system, a program operation of a nonvolatile memory device is completed without checking whether data '1' and data '1' or '0' of an unselected string are "fail". A nonvolatile memory device transfers a ready/busy (R/B) signal to a memory controller to indicate program end. Accordingly, the memory controller reads data corresponding to a pertinent address to confirm whether the program operation is normally performed (e.g., ECC). If program failure is checked according to the confirmation result, a program operation is performed to another wordline corresponding to another address. During these procedures, a data input/output operation is performed twice or more between the nonvolatile memory device and the memory controller.

On the other hand, in the memory system 10 according to the present invention, a nonvolatile memory device 12 checks whether data '1' and data '1' or '0' of an unselected string are "fail" and a program operation is completed. According to the result of the program operation, the nonvolatile memory device 12 itself performs a program operation to another wordline using data stored in page buffers when program failure occurs. Thus, a program operation may be performed to another wordline without inputting/outputting data between the nonvolatile memory device 12 and a memory controller 14 even when program failure occurs. As a result, the memory system 10 may overcome time overhead caused by program failure during a program operation more effectively than typical memory systems.

Figure 14:
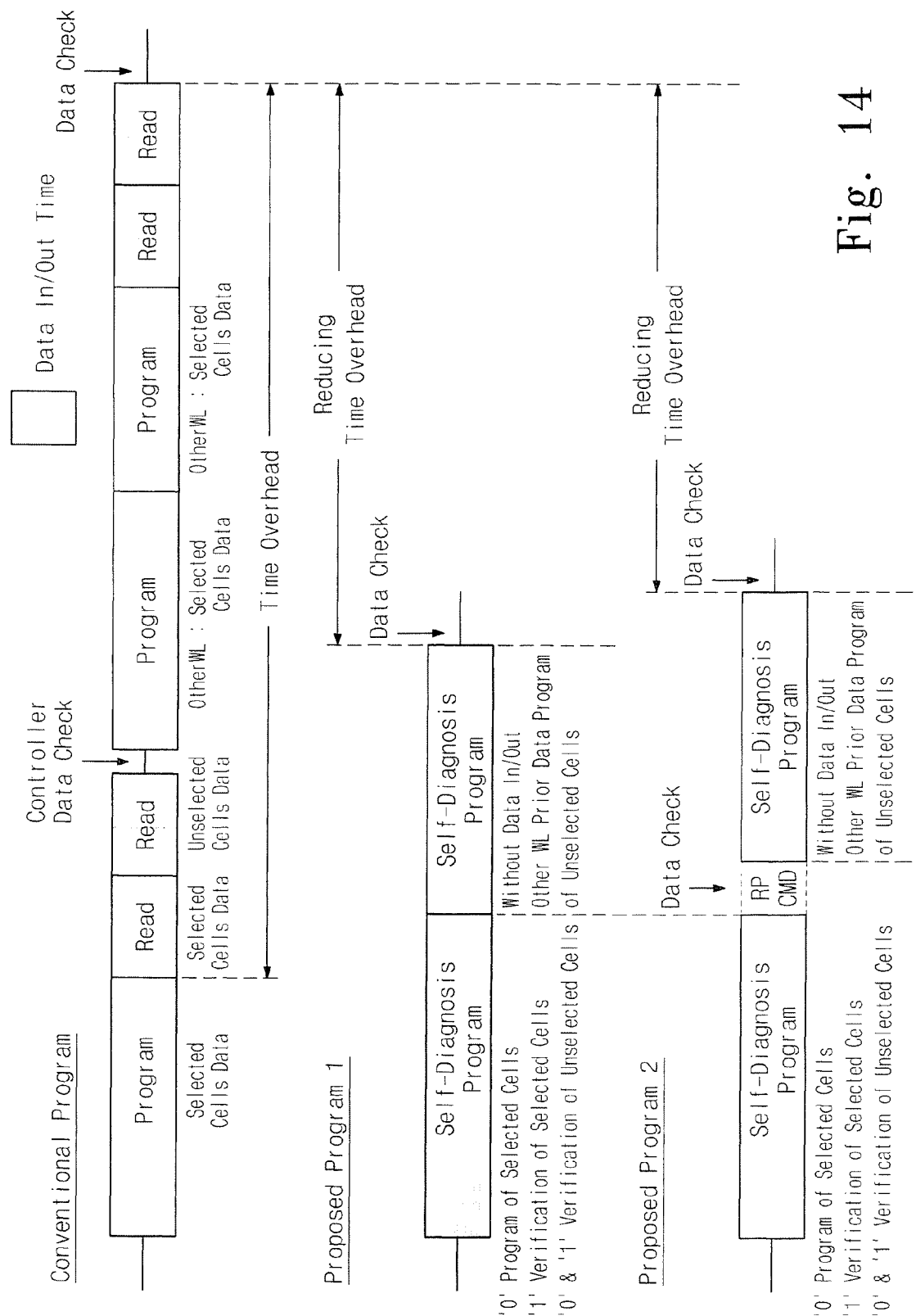
FIG. 14 comparatively illustrates total programming times considering reprogramming of a typical programming method and programming methods according to the present invention.

FIG. 14 comparatively illustrates total programming times considering reprogramming of a typical programming method and programming methods according to the present invention. Referring to FIG. 14, the programming method according to the present invention may be advantageous to reduce time overhead more considerably than conventional programming methods. As shown in FIG. 14, the programming method according to the present invention uses only one data input/output time while conventional programming methods use seven data input/output times.

As to a first programming method according to present invention, a nonvolatile memory device 12 itself performs a reprogram operation. The nonvolatile memory device receives data from a memory controller 14 to perform a first self-diagnosis program operation and performs a second self-diagnosis program operation without inputting/outputting separate data to/from the memory controller 14. During the first self-diagnosis program operation, a '0' data program operation is performed for selected cells, a '1' data verify operation is performed for the selected cells, and '0' and '1' data verify operations are performed for the selected cells and unselected cells. The selected cells mean program cells connected to selected bitlines, and the unselected cells mean memory cells connected to unselected bitlines.

If the program operation is determined to be "fail" based on the result of the first self-diagnosis program operation, the second self-diagnosis program operation is performed. During the second self-diagnosis program operation, a '0' data program operation is performed for the selected cells without inputting/outputting data to/from the memory controller 14 and previous data is programmed into the unselected cells. As mentioned above, the nonvolatile memory device 12 may considerably reduce time overhead during the program operation.

As to the second programming method according to the present invention, a reprogram operation is controlled by a memory controller 14. If a program operation is determined to be "fail" based on the result of a first self-diagnosis program operation, the memory controller 14 determines whether a reprogram operation should be performed based on a value of a flag bit stored in a failure check register. If the reprogram operation is determined to be performed, a reprogram command RP CMD and a new address are transferred to the nonvolatile memory device 12. The nonvolatile memory device 12 performs a second self-diagnosis program operation.

As to a programming method of a nonvolatile memory device according to the present invention, additional read/program operations are performed based on a program state not in a controller but in the nonvolatile memory device. Therefore, it is possible to decrease times of data input/output between a controller and a nonvolatile memory device during a program operation. As a result, overhead time may be considerably reduced to enhance operation characteristics of a system.

Furthermore, software/hardware burden on the controller may be considerably alleviated to reduce costs of the system.

The programming method according to the present invention may be applied to an MLC programming method. Generally, an MLC programming method may be divided into an LSB program operation for storing LSB data and an MSB program operation for storing MSB data. The LSB program operation may be performed based on the programming method described with reference to FIGS. 1 to 14, and the MSB program operation may be performed by adapting the programming method described with reference to FIGS. 1 to 14. In the MSB program operation, program cells are also verified using data to be changed and program inhibit cells are also verified using data to be maintained. Especially, each page buffer reads and store LSB data to prevent loss of the LSB data during the MSB program operation. The LSB data stored in the page buffer is used in an LSB data restoring operation.

Figure 15:
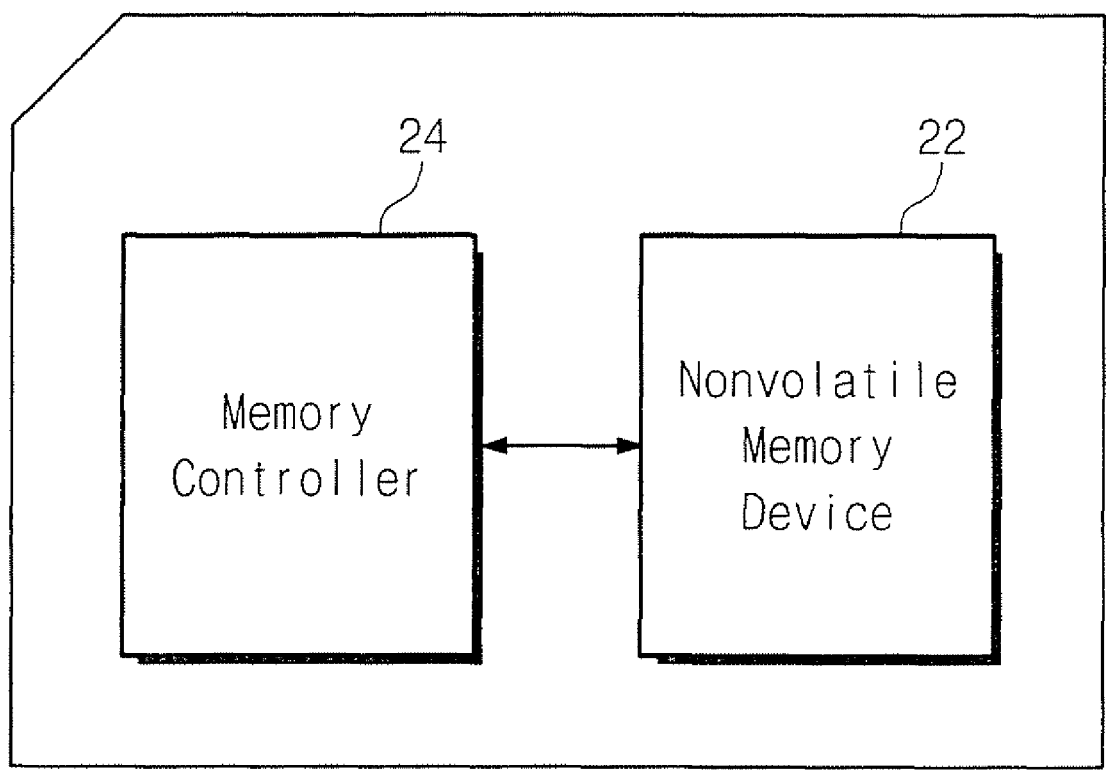
FIG. 15 illustrates a memory card including a nonvolatile memory device according to the present invention.

FIG. 15 illustrates a memory card 20 including a nonvolatile memory device according to the present invention. The memory card 20 includes a nonvolatile memory device 22 having the substantially same configuration as shown in FIGS. 2 and 6 and a memory controller 24 configured to control the nonvolatile memory device 22. The memory card 20 may be used to store/read data with digital apparatuses such as digital cameras, personal digital assistants (PDAs), portable audio devices, and personal computers (PCs).

Figure 16:
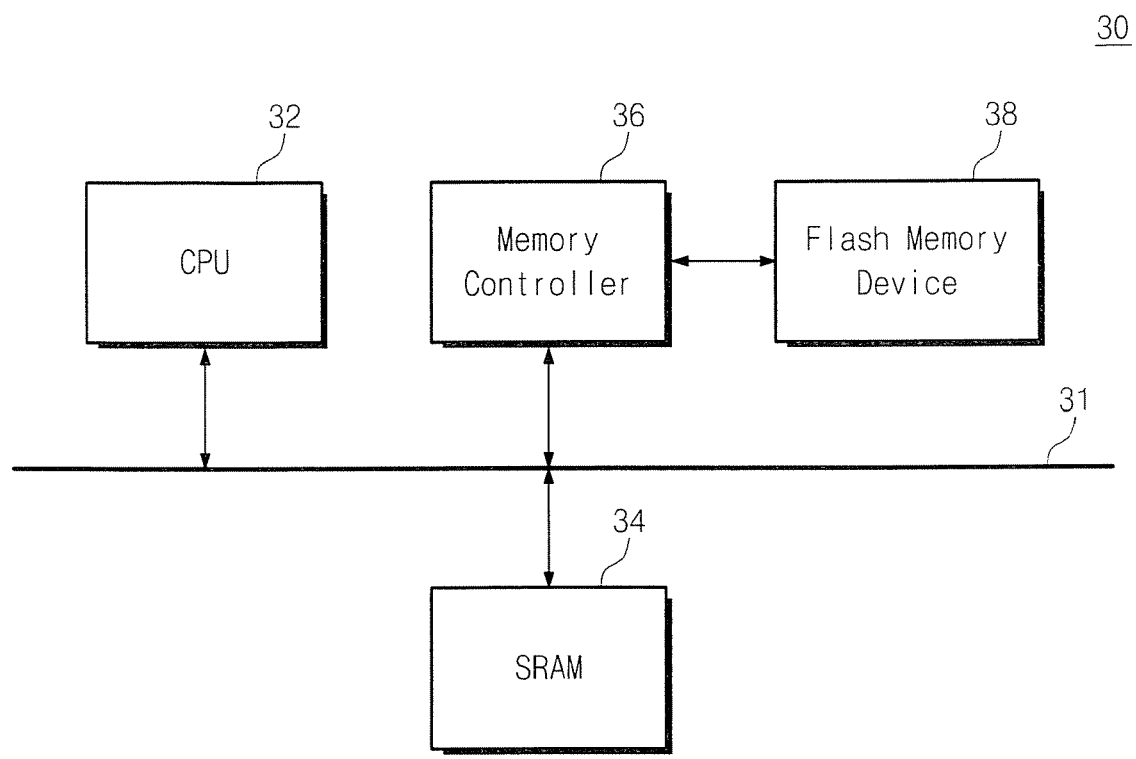
FIG. 16 illustrates a computer system including a nonvolatile memory device according to the present invention.

FIG. 16 illustrates a computer system 30 including a nonvolatile memory device according to the present invention. The memory system 30 includes a central processing unit (CPU) 32 electrically connected to a bus 31, an SRAM 34, a memory controller 36, and a flash memory device 38. The flash memory device 38 may have the substantially same configuration as shown in FIGS. 2 and 6. N-bit data (N being 1 or greater integer) processed or to be processed by the CPU 32 is stored in the flash memory device 38 through the memory controller 36.

Although not shown in this figure, it is apparent to those skilled in the art that the memory system 20 may further include an application chipset, a camera image processor (CIS), a mobile DRAM, and so forth. The memory controller 36 and the flash memory device 38 may constitute, for example, a solid-state drive/disk (SSD).

The flash memory device and/or the memory controller of the present invention may be mounted through various forms of packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level embodied package (WFP), wafer-level processed stack package (WSP), etc.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A nonvolatile memory device, comprising:
a nonvolatile memory cell array having word lines and bit lines therein; and
a control circuit electrically coupled to the word lines and bit lines, said control circuit configured to program a first plurality of nonvolatile memory cells in a first page of said nonvolatile memory cell array with first data using an incremental step pulse programming operation comprising a first plurality of verification operations that confirm whether all of the first plurality of nonvolatile memory cells have been sufficiently programmed, said control circuit further configured to follow said incremental step pulse programming operation with at least one operation to verify whether a second plurality of nonvolatile memory cells in the first page remain as program inhibited memory cells that have not been programmed.

2. The memory device of claim 1, wherein said control circuit is further configured to program a first plurality of nonvolatile memory cells in a second page of said nonvolatile memory cell array with the first data upon verification that at least one of the second plurality of nonvolatile memory cells in the first page has been erroneously programmed to have an excessively high threshold voltage.

3. A nonvolatile memory device, comprising:
a nonvolatile memory cell array having word lines and bit lines therein; and
a control circuit electrically coupled to the word lines and bit lines, said control circuit configured to program a first plurality of nonvolatile memory cells in a first page of said nonvolatile memory cell array with first data using a programming operation, said programming operation comprising at least a first verify operation to confirm that all of the first plurality of nonvolatile memory cells have been sufficiently programmed and at least a second verify operation to confirm that a second plurality of nonvolatile memory cells in the first page remain as erased memory cells.

4. The memory device of claim 3, wherein the at least a second verify operation follows a last of the at least a first verify operation in time during the programming operation.

5. A programming method of a nonvolatile memory device, the programming method comprising:
applying a program voltage to a plurality of program cells for changing data;
verifying the program cells, based on the changed data; and
verifying a plurality of program inhibit cells for maintaining stored data even when the program voltage is applied to the program inhibit cells, based on the stored data.

6. The programming method as set forth in claim 5, further comprising:
increasing the program voltage by a predetermined level to apply the increased voltage to the program cells, when verification of the program cells is fail.

7. The programming method as set forth in claim 5, wherein program failure occurs when verification of the program inhibit cells is fail, and information on the program failure is stored in a register.

8. The programming method as set forth in claim 7, wherein data to be stored in the program cells and the data stored in the program inhibit cells are autonomously reprogrammed to another portion in the nonvolatile memory device, based on the information of the program fail.

9. The programming method as set forth in claim 7, wherein an external controller performs control for the data to be stored in the program cells and the data stored in the program inhibit cells to be reprogrammed to another portion in the nonvolatile memory device, based on the information of the program fail.

10. The programming method as set forth in claim 5, wherein the program cells change from '1' data to '0' data, and the program inhibit cells are maintained at the '1' data.

* * * * *